United States Patent
Lesso

(10) Patent No.: US 8,624,669 B2
(45) Date of Patent: Jan. 7, 2014

(54) DC OFFSET COMPENSATION

(75) Inventor: John Paul Lesso, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 90 days.

(21) Appl. No.: 13/327,009

(22) Filed: Dec. 15, 2011

(65) Prior Publication Data

US 2012/0154032 A1    Jun. 21, 2012

Related U.S. Application Data

(60) Provisional application No. 61/423,835, filed on Dec. 16, 2010.

(30) Foreign Application Priority Data

Dec. 16, 2010  (GB) .................................. 1021393.2

(51) Int. Cl.
     *H03F 1/02*  (2006.01)
(52) U.S. Cl.
     USPC ............................................. 330/9; 330/137
(58) Field of Classification Search
     USPC ....................... 330/9, 11, 137; 327/124, 307
     See application file for complete search history.

(56) References Cited

U.S. PATENT DOCUMENTS

| | | | |
|---|---|---|---|
| 4,356,450 A | 10/1982 | Masuda | |
| 4,807,146 A | 2/1989 | Goodrich et al. | |
| 5,397,944 A | 3/1995 | DuPuis | |
| 5,789,974 A | 8/1998 | Ferguson, Jr. et al. | |
| 6,029,497 A | 2/2000 | Brinks et al. | |
| 6,756,924 B2 * | 6/2004 | Lee et al. | ...................... 341/120 |
| 7,042,252 B2 * | 5/2006 | Galloway et al. | ............... 327/16 |
| 8,416,019 B2 * | 4/2013 | Moses et al. | .............. 330/137 X |
| 2008/0068058 A1 | 3/2008 | Kim et al. | |

FOREIGN PATENT DOCUMENTS

| | | |
|---|---|---|
| GB | 2 196 495 A | 4/1988 |
| GB | 2459865 A | 11/2009 |
| WO | WO 2007/080528 A1 | 7/2007 |

OTHER PUBLICATIONS

K.P.S.Rafeeque et al., "A Built-in-Self-Test Scheme for Digital to Analog Converters," VLSI Design, 2004, Proceedings, 17th International Conference in Mumbai, India, Jan. 5, 2004, pp. 1027-1032.

* cited by examiner

*Primary Examiner* — Steven J Mottola
(74) *Attorney, Agent, or Firm* — Dickstein Shapiro LLP

(57) ABSTRACT

An apparatus and method for DC offset compensation. An amplifier receives an input signal ($A_{IN}$) and provides an amplified output signal ($S_{OUT}$) and a feedback path provides DC offset compensation. The feedback path comprises at least one voltage controlled oscillator (VCO) and a counter. The VCO provides, over time, a first VCO output signal based on said amplified output signal and a second VCO output signal based on a reference signal ($V_{REF}$). The counter generates first pulse counts based upon the first VCO output signal and second pulse counts based upon the second VCO output signal and provides a compensation signal based on a comparison of the first and second pulse counts. One voltage controlled oscillator may sequentially receive a signal based on said amplifier output signal and the reference signal from a multiplexer so as to sequentially produce the first and second VCO output signals.

25 Claims, 9 Drawing Sheets

DC OFFSET COMPENSATION

This application claims the benefit of U.S. Provisional Application No. 61/423,835, filed on Dec. 16, 2010.

BACKGROUND OF THE INVENTION

1. Field of the Invention

The present invention relates to apparatus and methods for DC offset compensation especially in audio circuitry such as audio amplifier circuitry.

2. Description of the Related Art

It is known that the presence of a DC offset voltage can cause problems in audio amplifier circuitry. In many applications an audio amplifier is driven with balanced positive and negative voltage supplies (e.g. +VDD and −VDD) so that the quiescent output voltage can be ground so that no AC coupling/DC blocking capacitor is required for the output signal when driving a grounded load. The presence of a DC offset voltage at the output of the audio amplifier can then lead to an offset voltage being suddenly imposed on the speaker load at power-up, or conversely suddenly removed at power-down, which may lead to an audio artefact such as an audible 'pop'. Such an audio artefact is undesirable and should be reduced, or preferably avoided, if possible. Further the presence of a DC offset voltage can lead to power wastage due to the resultant quiescent load current having to be sourced from a supply by the driver amplifier. Such wastage is an issue for battery powered devices where unnecessary power consumption reduces battery life.

A DC offset may arise in an audio amplifier circuit in a number of ways. The driver amplifier may have a random input offset voltage. In many typical audio devices the audio signal to be amplified is received in digital form and is converted to an analogue signal by an audio digital-to-analogue convertor (DAC) for subsequent amplification. This audio DAC may also suffer from random DC offsets. Charge injection effects, for example in a switched-capacitor DAC, or mismatch between sink and source currents in a current-steering DAC may be sources of DC offset. Further, the DAC may be driven between a single voltage supply (e.g. +AVDD) and ground, and thus the analogue output signal from the DAC may require level shifting from say AVDD/2 before being input to the amplifier. Errors in the level shifting may also introduce DC offset. Whilst efforts are made to minimise DC offset it is difficult to completely eliminate DC offset in practical circuits.

It is therefore known to provide extra circuitry to eliminate, or reduce, DC offsets, i.e. to provide DC offset compensation circuitry, in integrated circuits for audio amplifiers. One known DC offset compensation system has a feedback path which comprises an analogue-to-digital convertor (ADC) and a digital integrator or low pass filter. The analogue output signal from the amplifier is compared to a reference signal which corresponds to the desired quiescent DC output voltage, say ground, and the resulting output error signal is converted to a digital signal by the ADC and then digitally filtered or integrated to give high gain at DC but attenuate audio-band components in the resultant digital correction signal output from the filter. The correction, or compensation, signal may be combined with the input digital audio signal prior to the audio DAC or alternatively converted into an analogue signal by a separate DAC and combined with the analogue input signal for the amplifier. In either case any DC offset present at the amplifier output is cancelled by the high DC gain negative feedback.

Such an offset compensation circuit provides an accurate and useful method of compensating for a DC offset. However the ADC is a relatively large component. In integrated circuits larger circuit area leads to higher cost. Further in some applications there may a limit on the size of chip, for example in chip scale packaging it may be wished to limit the size of chip to match that of a standard ball array to avoid any strain mismatch effects or reliability issues arising from overhang of the silicon die over the ball array. Thus in some applications the use of relatively large circuit components is undesirable. This may be exacerbated by the need to provide respective DC offset compensation for a plurality of audio outputs. Many typical devices, such as a portable audio device, may have audio signal outputs for headphones, an audio line out for driving speakers, for example via a docking station, an audio signal line to internal speakers and, in some cases, audio outputs for noise cancellation speakers. Some or all of these outputs may comprise a stereo pair of outputs. Thus a single chip, i.e. a single integrated circuit, may comprise a plurality of audio signal outputs each with its own associated amplifier circuitry and each having its own associated DC offset which requires compensation. Providing a separate DC offset compensation circuit as described for each audio signal line would involve a relatively significant amount of chip real estate.

The known DC offset compensation circuitry described above can advantageously be multiplexed between several different audio signal lines to compensate for the DC offset for each signal line in turn. Once a stable DC offset correction has been achieved for a signal line, the value of the correction signal can be latched for that signal line and the compensation circuitry used to compensate for the DC offset on another signal line. However, clearly this does mean that settling time for reaching steady state compensation for the chip as a whole is equal to the sum of the individual settling times for each of the audio signal outputs. In some applications a relatively fast settling time may be required and multiplexing the offset compensation circuit between multiple outputs may thus not be possible.

SUMMARY OF THE INVENTION

Thus according to the present invention there is provided audio amplification circuitry comprising: an amplifier configured to receive an input signal and provide an amplified output signal; and a feedback path wherein said feedback path comprises compensation circuitry for outputting a compensation signal, wherein the compensation circuitry comprises: at least one voltage controlled oscillator (VCO) configured to provide, over time, a first VCO output signal based on said amplified output signal and a second VCO output signal based on a reference signal, and a counter configured to generate first pulse counts based upon the first VCO output signal and second pulse counts based upon the second VCO output signal and to provide the compensation signal based on a comparison of the first and second pulse counts.

According to a further aspect of the present invention there is provided a method of compensating for DC offset in an audio amplifier output signal, the method comprising the steps of:

receiving a signal based on the amplifier output signal;
receiving a reference signal based on a target DC offset;
driving a voltage controlled oscillator (VCO) with the signal based on the amplifier output signal to provide a first VCO output signal;
driving a voltage controlled oscillator (VCO) with the reference signal to provide a second VCO output signal;

generating first pulse counts based upon the first VCO output signal and second pulse counts based upon the second VCO output signal;

comparing said first and second pulse counts; and deriving a DC offset compensation signal from said comparison of pulse count.

In a further aspect of the present invention there is provided a DC offset compensation circuitry for compensating for DC offset in a first signal comprising: a voltage controlled oscillator configured to provide a first output signal based on said first signal and a second output signal based on a reference signal; and a counter configured to count the pulses of the first output signal and the second output signal and compare said pulse counts.

In a yet further aspect there is provided compensation circuitry for compensating for DC offset in a first signal comprising a voltage controlled oscillator and a counter.

Another aspect of the invention provides DC offset compensation circuitry for compensating for DC offset in a signal path wherein said compensation circuitry is multiplexed between a first feedback loop for compensating for offset in a first part of the signal path and a second feedback loop for compensating for offset in a second part of the signal path.

A yet further aspect of the invention provides an audio signal amplification circuit having an output, said circuit comprising a feedback path which comprises a voltage controlled oscillator and a counter, wherein the voltage controlled oscillator is responsive to the signal at said output.

BRIEF DESCRIPTION OF THE DRAWINGS

The invention will now be described by way of example only with reference to the following drawings, of which:

FIG. 3 illustrates the operation of the DC offset compensation circuitry comprising an integrating counter as shown in FIG. 2a;

DETAILED DESCRIPTION OF THE PREFERRED EMBODIMENTS

Figure 1:
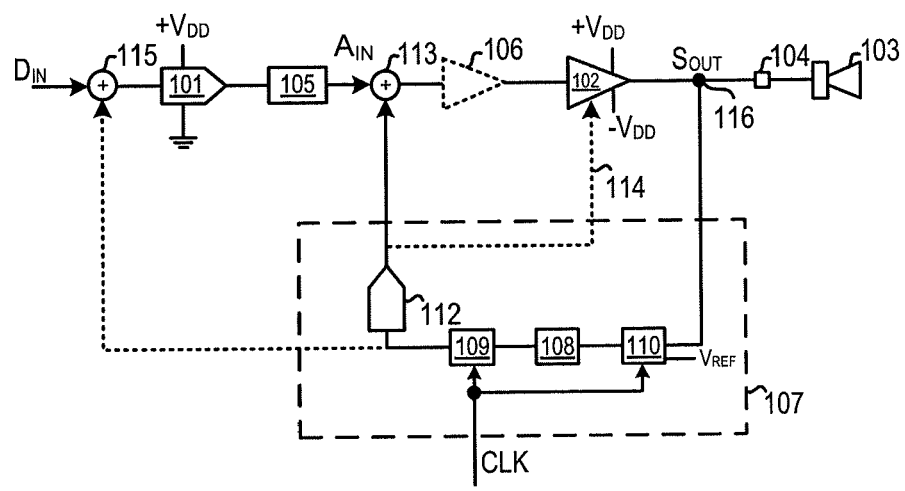
FIG. 1 illustrates an embodiment of an amplification circuit having DC offset compensation according to the present invention.

FIG. 1 illustrates an audio amplification circuit having DC offset compensation circuitry according to an embodiment of the present invention.

FIG. 1 shows an audio amplifier circuit that receives a digital input signal $D_{IN}$ at digital-to-analogue converter (DAC) 101. The DAC 101 converts the input signal to an analogue signal. An amplifier 102 receives and amplifies the analogue signal, $A_{IN}$. The amplified output signal $S_{OUT}$ is then supplied to a load 103, such as a loudspeaker. The load 103 may be internal to a host device, such as an internal speaker of the host device or may be external, such as a headphone speaker connected via an appropriate connection 104 such as a stereo jack plug.

The amplifier 102 may typically be supplied by bipolar voltage supplies, such as +VDD and −VDD whereas the DAC 101 may typically be supplied by a unipolar voltage supply, e.g. connected between single positive supply +AVDD (which may or may not be equal to +VDD) and ground. The quiescent DAC output voltage may thus be set to be about +AVDD/2. Thus there may be a need for level shifting circuitry 105 to shift the analogue output from the DAC 101 $A'_{IN}$ such that the level shifted analogue signal $A_{IN}$ input to the amplifier is notionally centred on ground. It will of course be appreciated that whilst FIG. 1 shows an embodiment receiving a digital input signal in some embodiments an analogue signal may be received instead and in some embodiments either an analogue or a digital signal may be received. In such embodiments DAC 101 will not be required, or may only be used when required, and, depending on the nature of input analogue signal, level shifting circuitry 105 may also not be required.

The amplifier circuit may also comprise one or more pre-amplifiers 106 in the audio signal path for pre-amplifying the analogue signal.

The amplifier 102, and any pre-amplifiers 106, may have a random, or systematic but maybe unpredictable, DC offset. Likewise the DAC 101 may have a random, or systematic but maybe unpredictable, DC offset. Errors in the level shifting may also introduce a random, or systematic but maybe unpredictable, DC offset.

On initial power-up of such a circuit, which usually occurs before any audio signal is received, any DC offsets inherent in the circuit will lead to a DC voltage in the output signal $S_{OUT}$. During at least the initial stages of power-up the output of the amplifier circuit may be isolated from the connection to the load. In a very simple scheme this isolation could be achieved by a series switch but the skilled person would be aware of other more sophisticated methods for isolating the amplifier from the load which avoid the need for switches in the signal path. In any event when the load is eventually connected this DC voltage will be imposed rapidly on the speaker 103, which can cause a noticeable audible artefact such as an audible 'pop' which is undesirable. A similar effect may occur if the circuit has been in an inactive low power mode, with the amplifier disabled to save power, and then is subsequently powered-up for use. Similarly on power-off the rapid drop in voltage may also cause a 'pop'. Also in normal operating conditions the presence of a DC offset in the output signal consumes power due to the resultant quiescent load current having to be sourced from a supply by the driver amplifier and results in unnecessary power wastage, which is a particular issue for battery powered devices.

The audio amplifier therefore comprises compensation circuitry 107 in the feedback path for compensating for DC offset voltage in the output signal $S_{OUT}$. The feedback circuitry 107 comprises a voltage controlled oscillator 108 and a counter 109.

A voltage controlled oscillator (VCO) produces an output (in effect a pulse train) with a frequency that depends on its input voltage. Changing the input voltage results in a change of frequency of the output pulse train. The VCO is configured, over time, to produce a first VCO output signal based on the amplified output signal $S_{OUT}$ and also a second VCO output signal based on a reference signal, $V_{REF}$. The reference signal, $V_{REF}$, is a voltage signal indicative of the target quiescent DC voltage. When the desired quiescent DC output voltage is equal to ground the reference signal may therefore comprise ground. However in other embodiments a particular DC level for a zero amplitude AC signal may be required and the reference signal $V_{REF}$ will correspond to such a target DC level. In the embodiment shown in FIG. 1 the first and second VCO output signals are generated at different times and the relevant input to the VCO 108 is selected by multiplexer 110: it will be understood by those skilled in the art that a multiplexer, and indeed a demultiplexer, are effectively controlled switches.

The counter 109 is arranged to generate pulse counts for the first and second VCO output signals, i.e. to generate first and second pulse counts respectively, and to compare the pulse counts so as to determine any difference in frequency of the first and second VCO outputs. The pulse count in a set period of time is a measure of the frequency of the VCO output, which depends on the input voltage of the VCO and hence a comparison of the pulse counts can be used as an indication of differences in the respective input voltages.

The polarity or sign, i.e. positive or negative, of a difference in pulse counts between the first and second VCO output signals, i.e. whether there are more or less pulses in the first VCO output signal than in an equal period of the second VCO output signal, may be used to determine whether the output signal voltage level is higher or lower than the reference signal. Further the difference in pulse counts gives an indication of the difference in voltage level between the two signals (the greater the difference in pulse count the greater the difference between the voltage levels of the output signal and the reference signal). This difference in pulse counts can therefore be used as the basis of the generation of a compensation signal as will be described in more detail below.

The use of a VCO 108 and counter 109 can therefore provide an accurate DC offset compensation circuit 107 that avoids the need for a conventional ADC in the feedback path. This reduces a possible source of offset error associated with the ADC of the feedback path which is advantageous. Further the VCO is significantly smaller than the ADC, as will be described below, allowing significant savings in area of silicon consumed by the circuit. In contrast to standard ADCs, the VCO/counter combination as used here requires no matched active or passive components, and little analogue circuitry, rendering it increasingly advantageous as silicon manufacturing technology migrates to smaller geometry nodes.

The VCO 108 and counter 109 are arranged to provide a desired level of accuracy of compensation. For example the DC offset may be cancelled to an accuracy of 100 μV or so.

In many applications the DC offset to be cancelled may be relatively small, say ±10 mV or so. Also in many applications the upstream signal may be muted during initialisation. There may be some thermal noise or quantisation noise (e.g. from a delta-sigma type of audio DAC 101) present but this will usually be filtered in the audio signal path so will be of the order of millivolts. Thus the linearity and range requirements of the VCO 108 may be relatively modest.

It will of course be appreciated that the VCO transfer function, i.e. the relationship between input voltage and output frequency, may vary over time, for example with temperature drifts or the like. Thus the exact relationship between input voltage and frequency may not be known at any given time. However, this is not a problem as, in the embodiment described above, the compensation circuitry provides a relative measure. Any difference in voltage between the DC offset in the output signal $S_{OUT}$ and the reference signal $V_{REF}$ will lead to a frequency difference in the first and second VCO output signals which will, in turn, result in a difference in pulse counts. In operation the compensation signal developed by the compensation circuitry 107 will bring the DC offset signal closer to the reference signal until, when they are equal, the same frequency will be produced in the first and second VCO output signals and there will be no difference in pulse counts. Thus any change in VCO transfer function, such as due to temperature changes or the like, does not affect operation of the correction circuitry 107.

The embodiment shown in FIG. 1 uses a single VCO 108 to generate both the first and second VCO output signals, however it will be noted that if two accurately matched, or accurately calibrated, VCOs were to be provided, i.e. two VCOs which, for a given set of operating conditions, have the same transfer function, the first VCO output signal could be generated solely by one VCO receiving a signal based on the output signal $S_{OUT}$ and the second VCO output signal could be generated solely by a second independent VCO receiving the reference signal. Thus the first and second VCO output signals could be generated simultaneously. The fact that the VCOs are relatively small means that they may be located close together in an integrated circuit. This means that two independent VCOs may thus experience the same general environmental conditions. However any differences in the VCO transfer function (or changes therein) of the two VCOs may lead to errors in the compensation circuitry. Even a small difference in the transfer function could lead to a significant error and thus the embodiment shown in FIG. 1 uses a single VCO 108 to generate both the first and second VCO output signals to avoid this possible source of error. In this way it doesn't matter exactly what the transfer function is or whether it changes slightly over time as both outputs are produced using the same VCO 108.

To provide the first VCO output signal based on the output signal $S_{OUT}$ and the second VCO output signal based on the reference signal the input of the VCO 108 is therefore multiplexed between the output signal $S_{OUT}$ and the reference signal $V_{REF}$ by multiplexer 110. The multiplexer 110, which may be any type of suitable controlled switching element, may be controlled by a clock control signal CLK to provide sequential periods during which the output audio signal $S_{OUT}$ or the reference signal $V_{REF}$ are input to the VCO 108. The clock control signal CLK may also be supplied to the counter 109 so that it can determine the relevant periods for the pulse counts. For ease these periods are arranged to be of equal duration so that the counter is inherently counting for equal periods of the first and second VCO outputs but other arrangements are possible. For example, the reference voltage $V_{REF}$ will typically be a clean, stable voltage signal whereas the output signal $S_{OUT}$ may have some noise component. As will be described later the outputs from the VCO may be effectively averaged over several cycles to improve accuracy. Providing a longer count period to generate first pulse counts for the first VCO output signal than for generating second pulse counts for the second VCO output signal may therefore help improve accuracy. If the count periods are unequal a scaling factor may be applied to either or both pulse counts as required.

It should be noted that although FIG. 1 shows that a signal input to the multiplexer 110 is coupled to the amplified output signal $S_{OUT}$, it will be appreciated that this signal $S_{OUT}$ may be level shifted or scaled appropriately before being input to the VCO 108. Provided that the signal input to the VCO 108 is representative of the DC offset of the output signal $S_{OUT}$, then the compensation circuitry 107 will correct for the offset in the output signal. Of course it will also be appreciated that any DC offset generated in the compensation circuitry 107 itself may lead to errors in the compensation and thus potential sources of DC offset in the compensation circuitry 107 should be eliminated wherever possible. If there is any level shifting or scaling circuitry the reference signal may likewise be scaled and/or level shifted, either by the same circuitry in a multiplexed fashion or by matched, or calibrated, level shifting circuitry.

The output of the counter may be used as the basis for the compensation signal. The counter may provide an output, representing the difference in pulse counts, which is positive or negative, indicating whether the current output signal is above or below the target DC level and also the relative difference between the DC levels. The output of the counter could be used each cycle, i.e. period of CLK, to provide an adjustment to a compensation signal. The value of this count signal may be added or subtracted to a digital compensation signal value and/or used to adjust an analogue voltage level.

It will be appreciated that, depending on the quiescent frequency of the VCO 108, and the frequency of the clock control signal CLK, there may be significant quantisation errors in a single cycle. However by making an adjustment each cycle over a series of successive cycles the quantisation errors can, in effect, be averaged out.

For example consider that the VCO 108 runs at a quiescent frequency of 200 MHz (i.e. the oscillation frequency with the VCO input at the reference level $V_{REF}$, say ground). Consider also that the clock speed of the CLK signal is 1.5 MHz. Each of the first and second pulse counts is based on half a clock cycle (as the VCO has the reference signal $V_{REF}$ as input for half the clock cycle and the output signal $S_{OUT}$ as input for the other half of the clock cycle). Thus in one half cycle of the control signal CLK the number of pulses is equal to (200 MHz/1.5 MHz)×0.5 which equates to 66.66 recurring. However the counter can only count a finite number of pulses and so the pulse count would either be 66 or 67 depending on where the relevant pulse edges fall within the counting window. This is a reasonably significant error over a single cycle.

Clearly the minimum detectable difference in pulse count in a single cycle is one pulse. Consider that the VCO has a voltage-frequency gain factor of 1 GHz/1V (which corresponds to 1 MHz/1 mV). A difference in pulse count of 1 therefore corresponds to a difference in frequency of (1×1.5 MHz)/0.5=3 MHz which in turn corresponds to an offset voltage level of 3 mV. Therefore, within any one cycle a difference in offset of up to 3 mV may not lead to a detectable pulse count difference. However by taking the counts from a succession of different cycles, and effectively averaging them the resolution of the compensation circuitry can be improved.

For example, consider the effect of combining the pulse counts (or pulse count difference) over 20 cycles. Simplistically the minimum count difference is a single pulse but a difference in a count of 1 pulse over said 20 cycles corresponds, in the example above, to a change in frequency of approximately 0.15 MHz which, at 1 GHz/1V, corresponds to a difference of 0.15 mV.

In one embodiment the counter 109 comprises an integrating counter which integrates the difference in pulse counts from a succession of cycles (either by integrating the difference determined each cycle or alternatively by integrating the pulses counts for each cycle and then determining the difference between the integrated pulse counts).

Figure 2A:
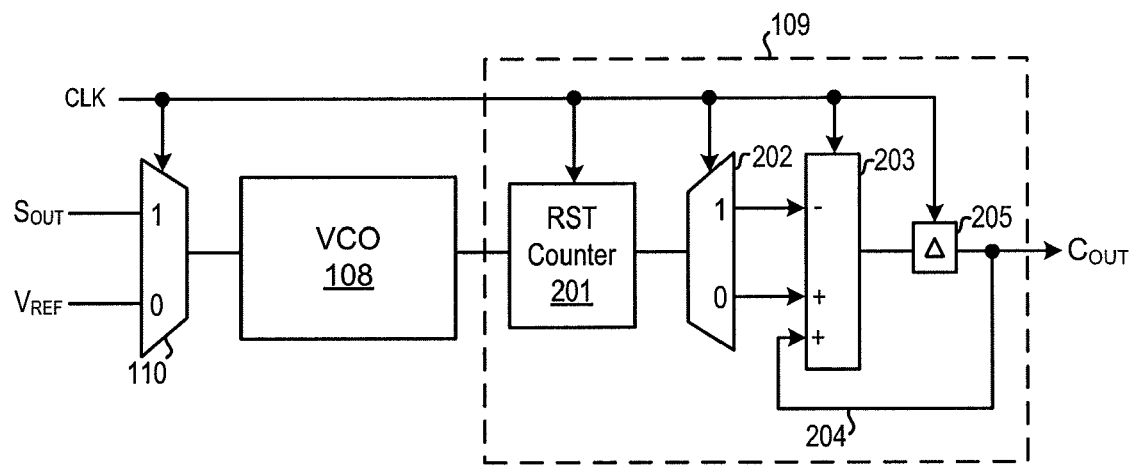
FIGS. 2a and 2b shows two embodiments of the DC offset compensation circuitry comprising an integrating counter.

FIG. 2a shows an embodiment of the compensation circuitry 107, within the feedback path, comprising an integrating counter 109. FIG. 2a shows an analogue multiplexer 110 that receives the output signal $S_{OUT}$ and the reference signal $V_{REF}$ and that is capable of passing each input separately to VCO 108. In the embodiment shown in FIG. 2 the multiplexer 110 is controlled based on a control signal CLK as described previously and so provides alternating equal periods of each input but other arrangements are possible. The pulse train output from the VCO 108 is input to a counter 201, the output of which is passed via demultiplexer 202 to summation block 203. The summation block is arranged to receive the separate counts during the alternate phases and, at the end of every cycle of the control signal CLK, to subtract the two counts to provide a count difference. This count difference, a digital number, is integrated in a first-order feedback loop 204 to average out the finite count error. The first-order feedback loop 204 is arranged with a delay (typically one cycle) before each output is added back into the signal in order to perform the integration. The delay may be implicit in the operation of summation block 203 but in some embodiments a delay element 205 may be included for providing this delay. The resultant integrated count value $C_{OUT}$ may be used as a digital compensation signal. In this implementation the counter will reset each half cycle in order to provide separate counts for the two VCO outputs.

In embodiments where the counter is arranged to count for equal periods of each VCO output the duty cycle of the clock supplied to the counter should preferably be 50:50. When the circuitry includes an audio DAC a high quality clock signal for clocking the DAC will usually be present (typically at 3 MHz). This audio DAC clock signal may be used to generate the clock signal CLK used by the counter and may be divided inside or very close to the counter to avoid introducing any mismatch between the edges due, for example, to possible mismatched transmission delays across an integrated circuit.

Figure 3:
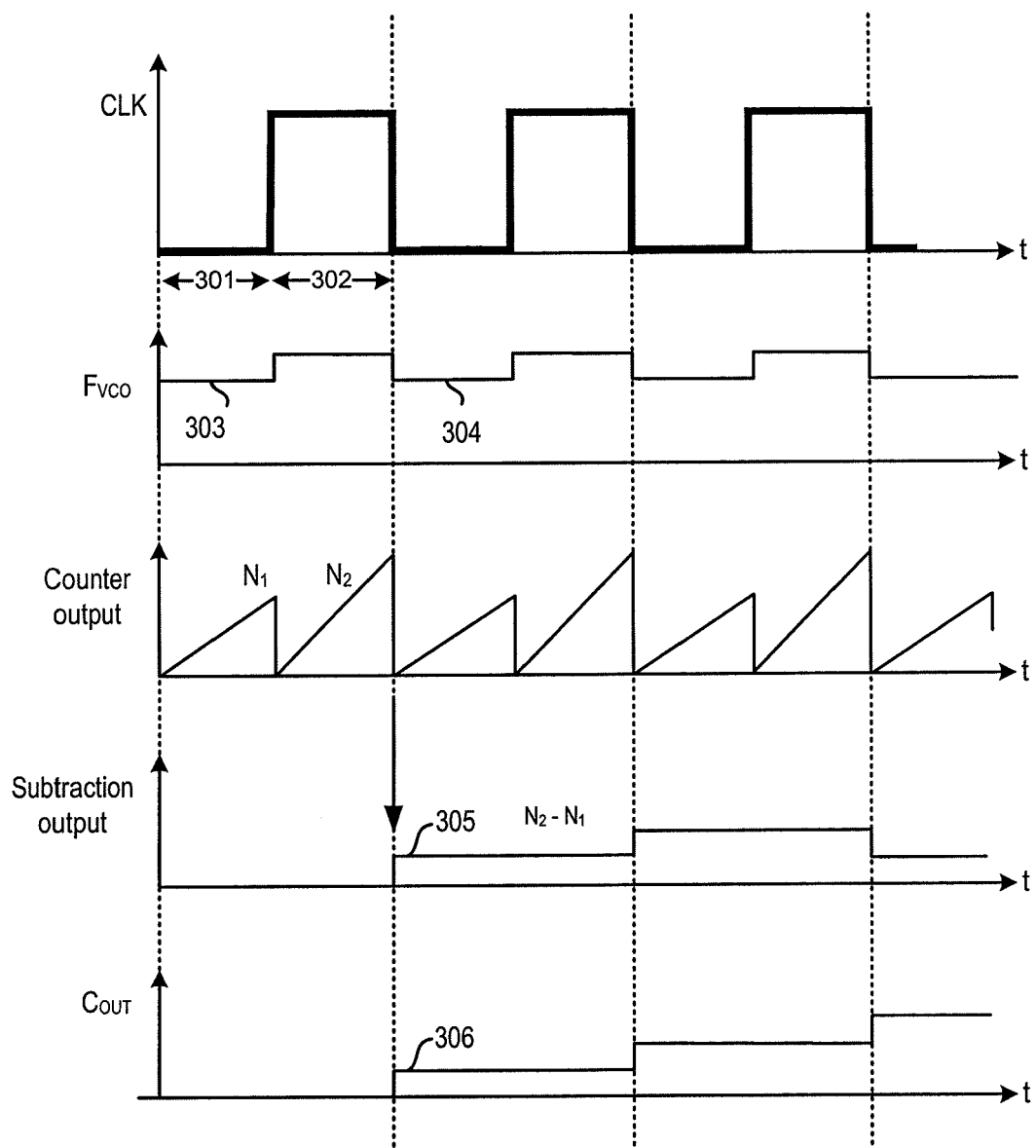

FIG. 3 illustrates the signals at various parts of the compensation circuitry shown in FIG. 2a. The control signal CLK is a two phase clock signal and controls the timing of the compensation circuitry 107, in particular the operation of multiplexer 110, resetting and sampling the counter, and the addition and delay elements. In the first phase 301 the output signal $S_{OUT}$ is provided to the VCO which results in a first VCO output signal 303 at a first frequency. In the second phase 302 the reference signal $V_{REF}$ is input to the VCO resulting in a second VCO output signal 304 at a different frequency. During each phase the counter is counting the number of pulses, i.e. generating first pulse counts based on the first VCO output signal and second pulse counts based on the second VCO output signal. At the end of each phase the total count is stored by the summation block and the counter reset. At the end of the cycle, i.e. the end of the two phases, the count during the second phase is subtracted from the count during the first phase (or vice versa). This value 305 represents the difference in count for the previous cycle but, as mentioned above suffers from finite count errors. Thus the difference in count is integrated over successive cycles to provide an integrated count value 306 which can be used as the compensation signal.

Figure 2B:
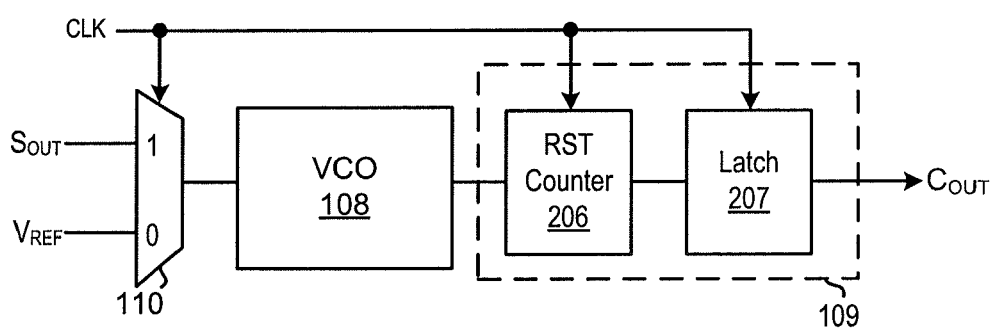

In an alternative embodiment the function of the integrating counter is provided by an up/down counter. Referring to FIG. 2b counter 109 may therefore comprise an up/down counter 206. The up/down counter 206 receives the control signal CLK and thus counts up (generates first pulse counts) during the period of the first VCO output signal (due to the output signal $S_{OUT}$ and counts down (generates second pulse counts) during the period of the second VCO output signal (due to the reference signal $V_{REF}$). At the end of a cycle of the control signal the resultant count value will therefore have increased or decreased by an amount equal to the difference in the first and second pulse counts. Further, if the up/down counter is not reset at the end of each cycle the counter will provide inherent integration. The value of the count from the up/down counter 206 may therefore be sampled, for instance by a latch 207, at the end of each cycle.

Figure 4:
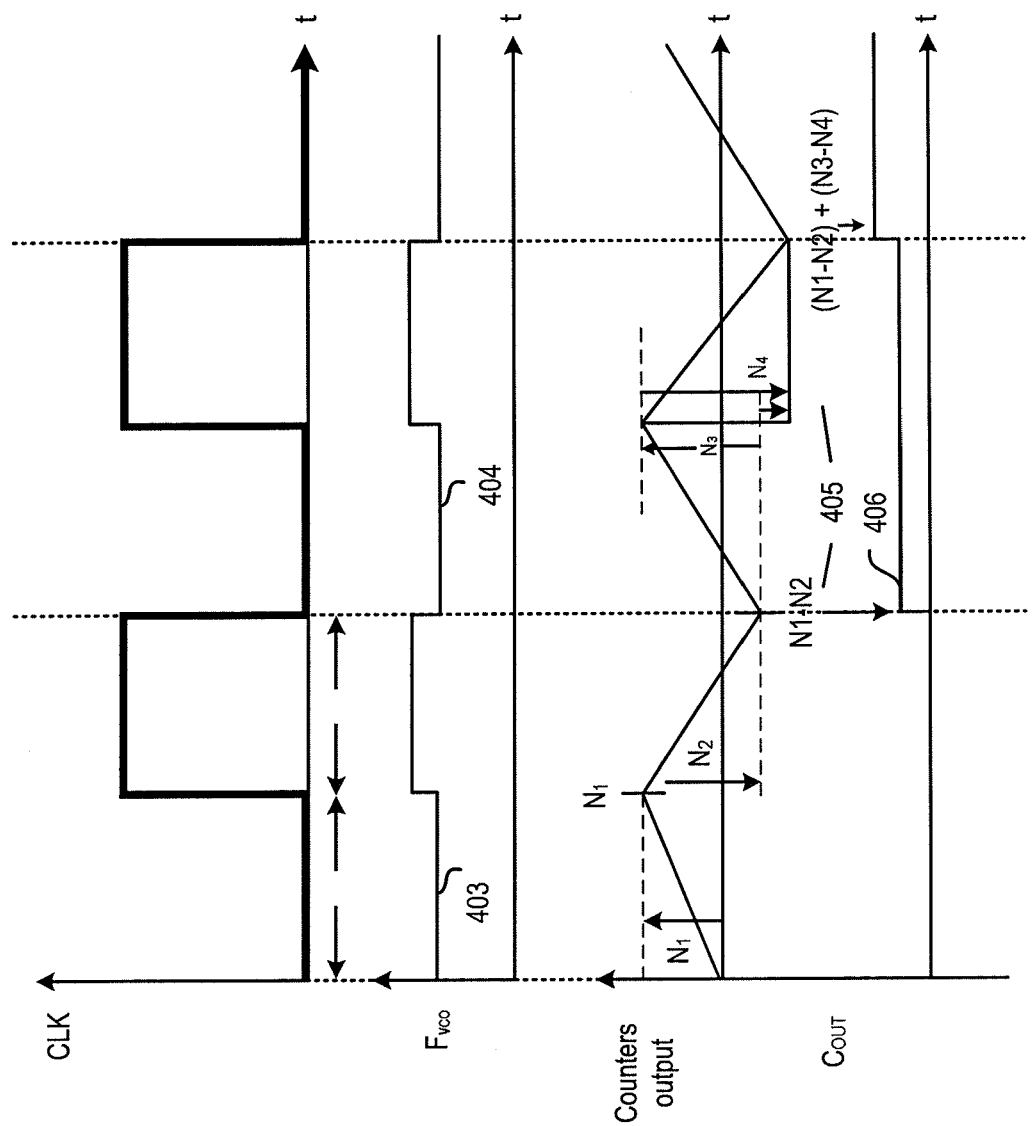
FIG. 4 illustrates the operation of the DC offset compensation circuitry comprising an up/down counter as shown in FIG. 2b.

FIG. 4 illustrates operation of such an up/down counter. The control signal alternates in phases 401 and 402 leading to first and second VCO output signals of different frequency 403, 404 as described previously. In this arrangement however the up/down counter counts up in the first phase 401 and counts down in the second phase. Thus over the course of a cycle the overall count will change by an amount equal to number of pulses in the first phase minus the number of pulses in the second phase. At the end of the second phase the up/down counter starts counting up again but the previous count value is not reset. The current count value 405 is sampled at the end of each cycle to provide the integrated value 406.

The integrated count value, however produced, thus may form the basis of the compensation signal. The integrated count value is a digital number which may be used to correct the input signal in a number of ways. Referring back to FIG. 1 the integrated count value output from counter 109 may be converted to an analogue signal by a compensation signal DAC 112 and combined with the analogue input signal, $A_{IN}$, at an analogue summing node 113 prior to the amplifier 102. The compensation signal DAC 112 may be a sigma-delta type DAC to reduce the number of bits required for the DAC and so make it simpler and smaller.

Rather than the compensation signal being injected directly into the signal path, the compensation signal may, via a path 114, be applied to an offset input of the amplifier 102 so as to modulate the input offset voltage of the amplifier 102 (and/or any other amplifier in the signal path). The compensation signal may be used to trim any mismatch directly at the input stage of the amplifier 102 by a variety of ways that are well known in the art. An advantage of directly adjusting the input stage of the amplifier 102 is that any offset can be cancelled, or at the very least minimised, independently of any gain setting that may exist around the amplifier 102.

Alternatively, where a digital input signal is received the digital compensation signal may be combined digitally with the digital input signal, $D_{IN}$, for example at node 115 prior to the DAC 101 of the audio path.

At this point it is noted that the terms signal path, feedback loop, feedback path and feedforward (or forward) path are used in this description. The paths or loops referred to be these terms will be explained with reference to FIG. 1. The signal path is the path taken by the audio signal from input to output. Thus as shown in FIG. 1 the signal path runs from left to right from $D_{IN}$ to output connector 104 (and ultimately to load 103 when connected). The feedback path comprises the path from tap node 116 in the signal path back to the summing node 113 via the compensation circuitry 107. The forward path or feedforward path corresponds to the part of the signal path between the summing node 113 and the tap node 116. Together the feedback path and the feedforward path comprise the feedback loop.

It will of course be appreciated that FIG. 1 shows various alternatives, if instead the compensation signal is fed back to summing node 115 then this node represents the end of the feedback path and the start of the feedforward path. If the compensation signal is supplied directly to modulate the amplifier, then path 114 may comprise part of the feedback path and the forward path starts at the amplifier.

Figure 5:
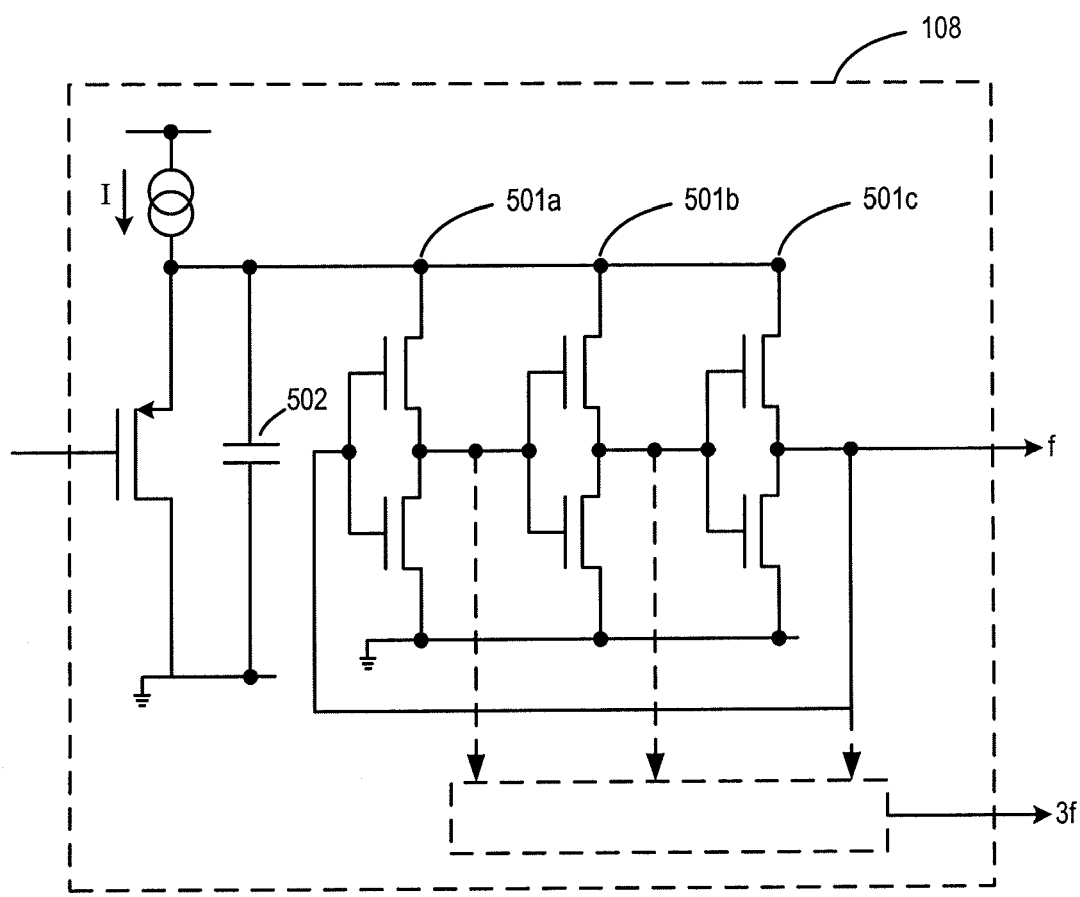
FIG. 5 shows one embodiment of a suitable VCO.

As mentioned above the use of a VCO 108 and counter 109 provides an accurate offset correction circuit that is relatively small in area. The VCO 108 itself can be relatively very small. The skilled person will be well aware of suitable VCOs that could be used. For example the VCO could comprise a chain of N small inverters 501a-c such as illustrated in FIG. 5. In some embodiments the VCO may also include a decoupling capacitor 502 for power supply ripple rejection (PSRR). A further variation is to use the output of each stage, and clock subsequent circuitry when an edge appears on any one stage, to increase the effective frequency and hence resolution of the VCO.

Thus the offset compensation circuitry of this embodiment of the present invention can be significantly smaller than offset compensation circuitry of the prior art which requires large area ADCs. For example, in one silicon process geometry, one ADC used in conventional offset compensation for audio amplifiers comprises a silicon area that is over seven times that required for the VCO and counter according to an embodiment of the present invention. This reduction in silicon area required provides a significant saving in cost.

The relatively low area consumed by the compensation feedback circuitry means that the need to multiplex the offset compensation circuitry between a large number of different audio signal paths is reduced. Thus, for circuits having a plurality of different audio outputs, more than one DC offset compensation circuit may be provided to reduce or eliminate the need for multiplexing, without unduly increasing the chip area required. For example each individual audio signal output line could be provided with its own dedicated offset calibration circuit and/or a small number of audio signal lines may share a DC offset compensation circuit, which may also avoid the need for long interconnections for connecting to a shared compensation circuit and thus reduce signal pick-up problems.

Figure 6:
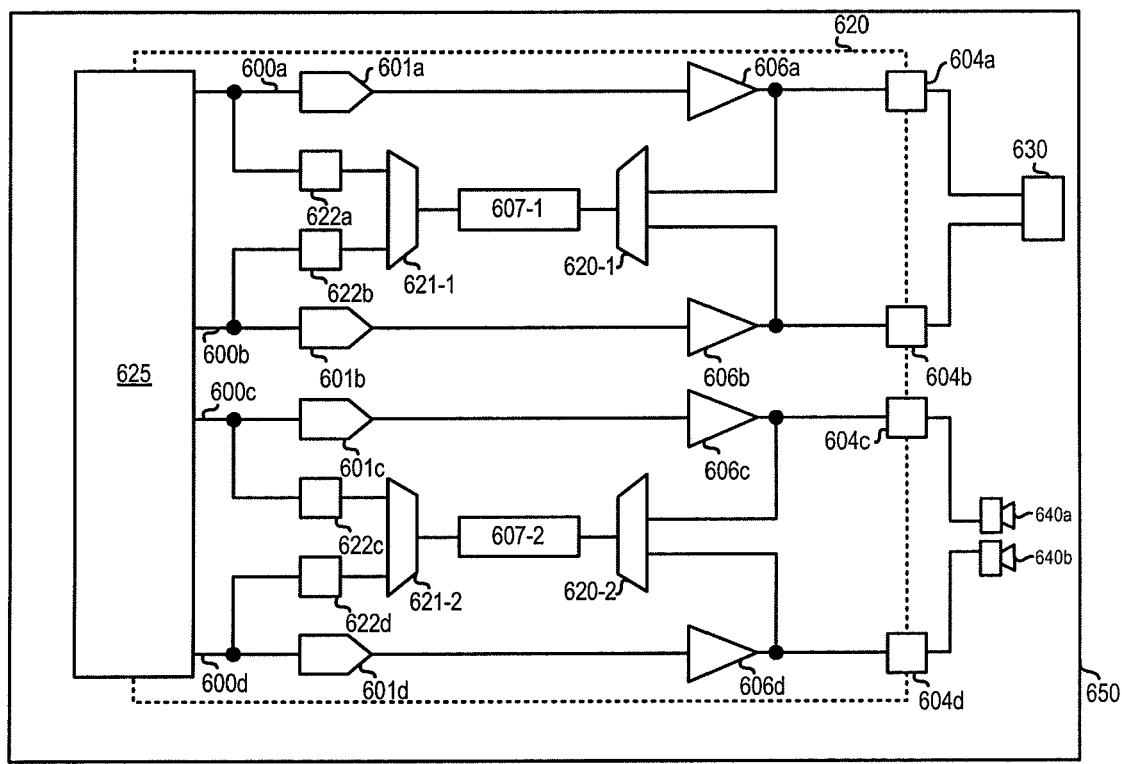
FIG. 6 shows an embodiment of an audio circuit of a device having a plurality of audio outputs and a plurality of offset compensation circuits.

FIG. 6 shows an example of a circuit 620 having four audio signal paths 600a-d, each having a DAC 601a-d, an amplifier 606a-d and an output terminal 604a-d. Signal paths 600a and 600b may, for example form a stereo pair for a headphone output 630 and signal paths 600c and 600d may, for example, comprise a stereo pair for internal loudspeakers 640 of a host device 650. The signal paths may be provided by audio processing circuitry 625 which may be part of the same integrated circuit 620 as the signal paths or may comprise a separate circuit.

Each stereo pair of signal paths, i.e. 600a and 600b or 600c and 600d is provided with an offset compensation circuit 607-1, 607-2 which is multiplexed, i.e. switched, between the relevant two signal paths by multiplexers 620-1, 620-2 and demultiplexers 621-1, 621-2: it will be understood by those skilled in the art that the multiplexers and demultiplexers are examples of switches.

In operation, for example on power-up, multiplexer 620-1 supplies the output from one of the signal paths, e.g. 600a, to the compensation circuit 607-1. The resulting compensation signal is passed by demultiplexer 621-1 back to the relevant signal path, 660a. The feedback loop operates until a stable compensation signal is developed which compensates for the DC offset in the output of the relevant signal. Acquiring a stable compensation signal may be taken to have occurred after a certain set period of time or alternatively may be determined by monitoring whether the compensation signal is no longer changing or only changing by less than a threshold amount. This stable value of compensation signal is then latched in the appropriate latch, e.g. 622a. In the embodiment shown in FIG. 6 the compensation signal is latched in a digital latch which feeds into the digital input of the relevant signal path but alternatively an analogue signal value could be latched and fed into to analogue signal path or indeed could be applied to an offset input of the amplifier 606a so as to modulate the input offset voltage of the amplifier 606a (and/or any other amplifier in the signal path). Once the correction for the first signal path, e.g. 600a, is latched the process will repeat for the other signal path, i.e. 600b, and multiplexers 620-1 and demultiplexer 621-1 will provide a path to signal path 600b. The compensation process will then be performed for signal path 600b and the stable compensation signal value latched in latch 622b. In parallel with the compensation for signal paths 600a and 600b the compensation circuitry 607-2 will be performing similar DC offset compensation for one and then the other of signal paths 600c and 600d.

As the compensation for DC offset for signal paths 600a and 600b occurs in parallel with the compensation for signal paths 600c and 600d it will be clear that the overall time to achieve compensation is reduced as compared to using a single compensation circuit and compensating for each signal path in turn.

Although only four signal paths are shown in FIG. 6 some audio circuits may comprise more signal paths. For example there may additionally be a stereo pair of outputs for a line-out signal and also a stereo pair of outputs for noise cancellation speakers. Were an audio circuit with four pairs of stereo outputs produced, then using the known offset compensation circuit having an ADC it may be necessary to multiplex the compensation circuitry between all eight outputs for reasons of chip space. This would still result in an ADC consuming a large amount of silicon area. However if an offset compensation circuit as described above were associated with each stereo pair the chip area consumed by the VCOs and counters of the offset compensation circuitry would still be smaller than the area consumed by the single conventional ADC (by a factor of about 1.8 in one particular geometry) but would allow compensation for all eight outputs to be achieved approximately four times faster.

In some applications there may be a relatively short period available for DC offset compensation of multiple audio signal paths. For example a short time may be allowed after power-on before all audio signal paths should be operational or where the audio amplifier chain is powered down in periods of no audio input to save power. This may therefore require the overall time to compensate for the DC offset for each signal path to be short. Being able to provide offset compensation circuitry for each signal path, or each pair of signal paths, without a large increase in chip area is an advantage of embodiments of the present invention.

Even with a single signal path however it may be advantageous to be able to guarantee accurate compensation within a short period.

The time taken to reach an accurate compensation signal clearly depends on the level of starting DC offset and the accuracy required. It also depends on the closed loop bandwidth of the feedback loop. This bandwidth is equal to the unity gain bandwidth of the open loop, which is defined by the transfer functions of the various elements cascaded in the feedback loop. These include:

i) the conversion gain of the VCO, i.e. the difference in pulse count (e.g. expressed as the number of bits) per cycle for a given change in the VCO input (in the example described above the VCO has a conversion gain of 1 bit/3 mV);

ii) the transfer function of the counter: for signals of low frequency compared to the sampling period T (T=1/(1.5 MHz) in the example), may be approximated as an ideal integration $1/sT$ where s is the Laplace variable;

iii) the conversion gain of the DAC 101 or 112 in terms of voltage out per least significant bit (LSB);

iv) the gain of the elements (DAC, amplifier) in the feedforward path; and v) any gains or losses associated with the multiplexer, any level shifting, or any other elements in the feedback path (for simplicity these will be ignored in the discussion below).

To consider the effect of the feedback loop bandwidth on the time taken to reach a accurate compensation signal (the settling time) assume that the gain of the elements in the feedforward path is unity, and the conversion gains of the VCO and DAC cancel (i.e. the voltage to produce a single bit difference in the pulse count of the VCO output is the same as the voltage per LSB of the DAC). In this case the open-loop loop transfer function is reduced to a simple integration, with frequency magnitude response $1/(2 \cdot \pi \cdot f \cdot T)$, where f is the signal frequency. This transfer function has a unity gain bandwidth of $1/(2 \cdot \pi \cdot T)$, which is thus also the −3 dB bandwidth of the closed loop. In other words, the closed-loop response will be first order with a time constant equal to T. In the example with a sampling period T=1/1.5 MHz=0.66 µs, the bandwidth would thus be $1.5 \text{ MHz}/(2 \cdot \pi) = 250$ kHz and the closed loop settling time constant 0.66 µs To settle linearly from an initial DC offset 10 mV to a corrected DC offset of 100 uV or so would require ln(100)=4.6 time constants, or about 3 µs. In practice the dynamics of settling would be degraded by non-linearities due to the finite resolution, but settling to 100 uV would be expected to be still rapid, less than say 20 us.

During calibration, the effect of a coarse resolution of the DAC might be mitigated somewhat by the finite bandwidth of the forward path smoothing out the amount of DAC quantisation noise appearing at the output $S_{OUT}$. However, after completion of calibration, a fixed digital code would be input into the DAC. If its resolution was only 3 mV per LSB, the d.c. voltage output from the circuit would usually be a lot larger than 100 µV. In practice, a DAC resolution of under 100 uV would be necessary, say in the range 10 uV to 50 uV to allow for a few LSB of error at the instant where the feedback loop is disabled and the correction code stored.

If the DAC resolution were reduced to say 30 uV from 3 mV, then the gain, and hence the unity gain bandwidth of the integrating feedback loop would also be reduced by a factor 100, e.g. to 2.5 kHz in the example above. This might allow ideal linear settling from a 10 mV initial error to a 100 uV final error in nominally about $4.6/(2 \cdot \pi \cdot 2.5 \text{ kHz})=300$ us, but in practice the non-linearities in the settling, other sources of error, and the manufacturing and process tolerances of the gain of a simple VCO (maybe −50%, +100%), would make it hard to guarantee even a 1 ms settling to a measured 100 µV accuracy. A 1 ms settling time may be too long for some applications.

In one embodiment therefore the feedback loop has a variable gain so that the voltage resolution of the feedback loop can be varied. During the initial stages of offset compensation the voltage resolution of the feedback loop may be relatively coarse but the bandwidth relatively large so that relatively large adjustments are made quickly. During a later stage the resolution of the feedback loop may be increased so that finer adjustments are made and the loop compensates to a better accuracy albeit with a longer time constant. In some embodiments the gain of the feedback loop may be successively increased in a number of stages. In this way the bandwidth of the compensation circuitry may be varied. It will be understood that as used herein the term bandwidth used in reference to the feedback, i.e. compensation, circuitry refers to the unity gain bandwidth of the feedback loop.

The feedback loop voltage resolution could be altered by altering the gain of DAC, say by altering a reference voltage, or current, supplied to the elements of the DAC, for example by programming a resistor string or other simple known ADC. However, particularly in the case where the compensation signal is applied to the signal path. i.e. the feedforward path, via audio DAC 101, which may be a delta-sigma DAC of say 20-bit or 24-bit resolution, it is preferable to adjust the gain of the feedback loop by a digital gain element which may, for instance, be a multiplier. The multiplier may, for instance, be a simple bit shifter to give gain in powers of 2. The gain element may initially be set to provide a high multiplier value and to reduce the multiplier value during the compensation process.

The gain element could be provided to act on the output of the integrating counter, with the output of the gain element being used as the compensation signal, but in this case a change in the multiplier value may result in a significant step change in the value of the compensation signal. This may introduce further delays into the settling time.

The gain element may therefore be implemented such that the present value of the compensation signal (at the time of any change in gain) is maintained but the minimum change to the compensation signal is reduced. This can be achieved by applying a gain factor to the value of the per cycle count difference before integration.

Figure 7:
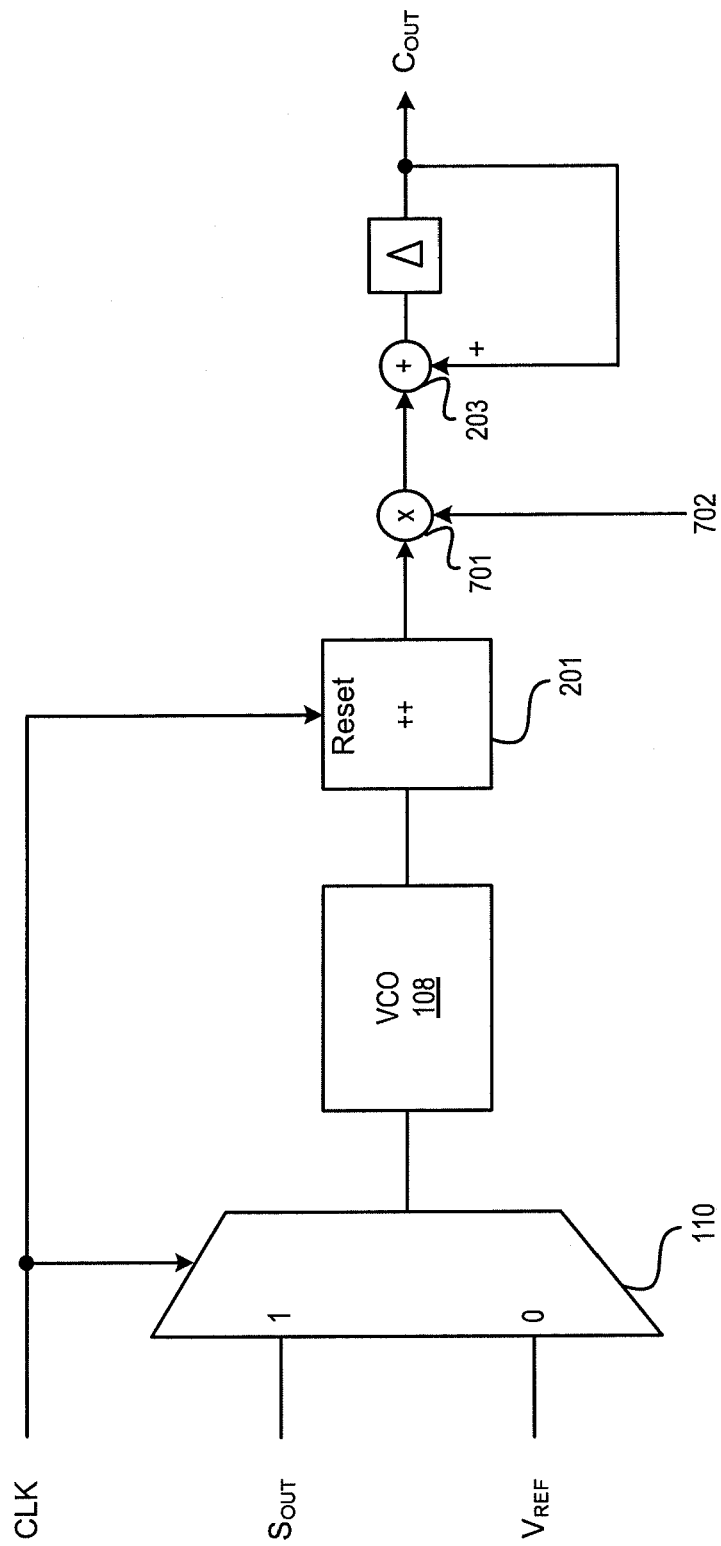
FIG. 7 shows an embodiment of the offset compensation circuitry with a variable gain.

FIG. 7 therefore shows an embodiment of the feedback path similar to that shown in FIG. 2 wherein similar components have similar numerals. In this embodiment however a gain element 701, which is a multiplier, is provided at the output of the counter 201. Gain element 701 is controlled by a bit weight control signal 702 so as to apply a desired bit weighting.

For example if a bit weighting factor of 1 provides the base feedback resolution of the loop, each LSB may represent say 30 uV out of the DAC: An initial weighting factor of 10 may be applied so that the minimum adjustment is equal to 300 uv. This would result in some relatively large adjustments being made relatively quickly. After a relatively short time, when the DC offset will have been corrected to within say 1 mV the bit weighting may be changed to a factor of 1 say to provide a minimum step of 30 μV.

Applying the bit weighting to the output of the counter 201 thus only changes the amount of adjustment made to the integrated compensation signal $C_{OUT}$ in each cycle and does not result in a step change of the integrated compensation signal itself.

In some embodiments however the counter 201 may be replaced by an integrating counter such as an up-down counter 206 as discussed above which is not reset each cycle. In this case the output from the counter may inherently comprise an integrated count value. A bit weighting may still be applied by differentiating the output of the counter, applying bit weighting via a gain element, and reintegrating the output from the gain element.

Figure 8:
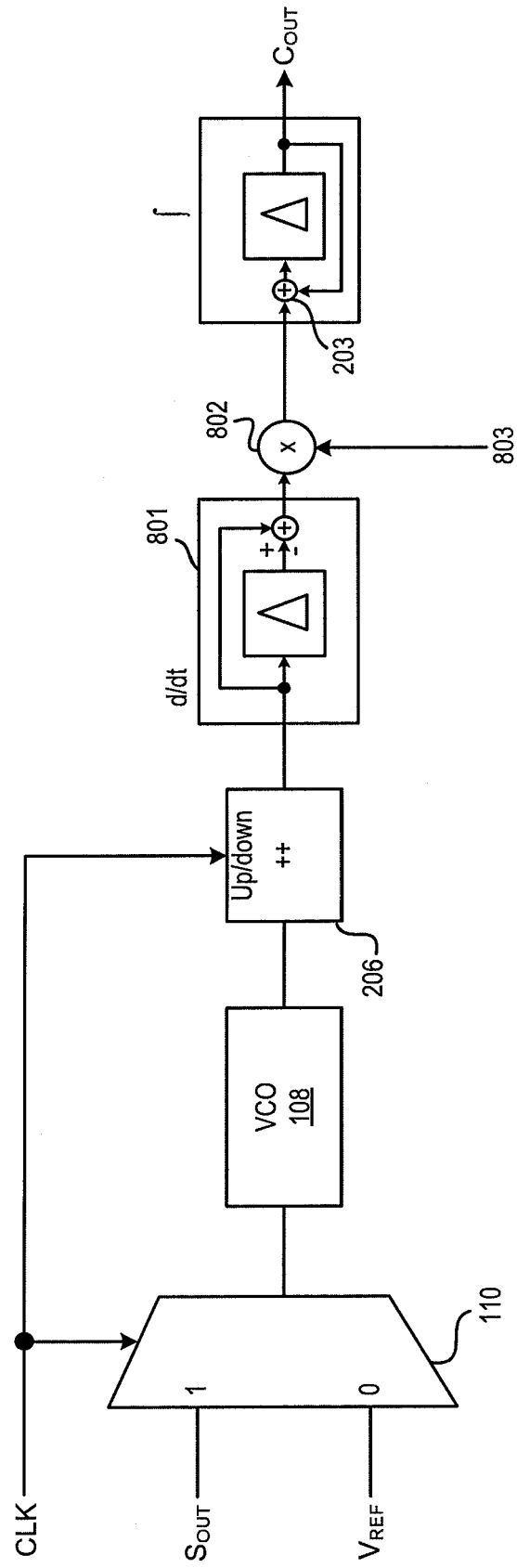
FIG. 8 shows another embodiment of the offset compensation circuitry with a variable gain.

FIG. 8 shows another feedback path according to this embodiment of the invention. Multiplexer 110 and VCO 108 operate as described previously and up/down counter 206 counts up in one phase and down in the other phase of the clock signal CLK to provide an integrated difference count as described previously. Differentiator 801 differentiates the output to determine the per cycle change and the output of the differentiator is multiplied by gain element 802 in response to bit weight signal 803 in the same manner as described in relation to FIG. 7. The multiplied bit weight signal is then reintegrated by an integrating loop 203 such as shown in FIG. 2a.

Other arrangements for applying a variable gain exist and could be used in other embodiments, for example the output from the integrating up/down counter could be divided into two paths, one path differentiated to provide the per cycle difference which could then be multiplied by a gain factor and added to the other path.

The embodiments of the compensation circuitry described above can be used in the presence or absence of an audio signal. In many applications however DC offset calibration may only be required in situations when an audio signal is not present.

For example, at power-on of an audio device the compensation will need to run to compensate for any inherent DC offset. Such compensation typically occurs before an audio signal is supplied to the amplifier circuit. Thus the output signal $S_{OUT}$ will basically correspond entirely to DC offset. Once the DC compensation has stabilised the value of the correction, i.e. compensation, signal is latched and further compensation is not required. There may be small drifts in the level of DC offset during operation, which may lead to slightly increased power consumption, but such small drifts are not generally significant and don't give rise to any audible effects.

At power-off (or power down to a low power mode) the audio input may be muted, sometimes gradually, before disconnecting the amplifier from the load. At this point the sudden removal of any DC offset developed during operation would result in an audible artefact. Thus DC compensation may be applied, but with a reasonably long time constant, for example by setting a low value for the gain of gain element 701, so as to reduce the DC offset in a gradual fashion before disconnecting the load from the amplifier.

In some embodiments therefore the offset compensation circuitry may be designed to operate only in the absence of an audio signal. In such case calibration is still possible while the amplifier circuitry remains powered but should preferably be conducted at periods of no input audio signal. The absence of an input audio signal may be detected in a number of ways.

Designing offset compensation circuitry that operates only in the absence of an audio signal reduces the range and linearity requirements for the VCO and hence eases circuit design and potentially reduces cost.

However the embodiments of the offset compensation circuitry described above can function correctly even in the presence of an input audio signal, provided that the VCO has the required linearity over the range of input voltages expected in the presence of a signal.

The presence of an audio signal will mean that the instantaneous voltage value of the output signal $S_{OUT}$ at any time may not accurately reflect the DC offset level. However over the course of the settling process the audio dependent variations will average out and, as the offset compensation circuitry integrates over a relatively large number of cycles the resulting difference in pulse count due to the output signal $S_{OUT}$ and the reference signal $V_{REF}$ will be due to any difference in DC offset. Thus no explicit filtering is required, although in some embodiments the output signal may be filtered to provide stronger attenuation in the audio band, either before the analogue input to the multiplexer or digitally after the counter Thus the compensation circuitry may operate in the presence of an audio signal to provide continual or periodic correction for DC offset.

The embodiments of the present invention may be able to compensate for all sources of offset in the audio signal path. The accuracy is limited only by the voltage resolution of the compensation signal applied via the DAC (including any scaling factor(s), whether of the DAC or otherwise) and any DC offset in the feedback path itself.

However the VCO introduces very little offset and the elimination of the need for a conventional ADC results in a feedback loop with very little error which is advantageous. Sources of error in the feedback path principally include: a. any offset induced by the multiplexer, for example due to charge injection mismatch between CMOS transmission gates; and b. consistent error in the duty cycle of the counter. As mentioned previously any error in duty cycle of the counter can be minimised by generating a matched divide-by-two clock signal physically close to the counter logic. Thus embodiments of the invention may include a clock divider for dividing a master clock signal in two to provide a signal for clocking the counter wherein the clock divider is configured to be physically adjacent the counter logic, i.e. a short distance away from the counter, such as less than 100 µm or so and possibly within 10-20 µm.

As mentioned the compensation signal may be supplied before an audio DAC 101 (if present) or combined with the analogue input signal to compensate for the whole offset in the audio signal path. In some embodiments however, variation of a variable gain in the audio signal path, for example a volume signal, may result in a step change in the DC offset.

For example consider an audio signal path consisting of an audio DAC, a variable gain element and an amplifier. If, for a first gain setting of the variable gain element, the DAC has a certain DC offset that, in the absence of any correction, equates to an effective offset of +2 mV and the amplifier has an effective DC offset of +3 mV then the total offset that would appear at the amplifier output would be +5 mV (ignoring any offset from the variable gain element itself for simplicity). If the gain of the variable gain element is changed, to a second gain setting, this will clearly have an effect on the DC offset contribution from the DAC but it may have no effect on the DC offset contribution from the amplifier. Thus, for example, if the second gain setting represents an increase in gain of a factor of 1.5 over the first gain setting, the notional DC offset contribution from the DAC will increase to +3 mV. Thus in the absence of any correction a change from the first to the second gain setting would result in a jump in DC offset from 5 mv to 6 mV.

If a compensation, i.e. correction, signal is applied to the signal path then, whilst the gain of the variable gain element is at the first gain setting, the compensation signal will, over time, settle to steady state value that results in a compensation of −5 mV so that the resulting output from the amplifier, in the absence of any signal, is 0V. If this compensation signal is applied to the signal path after the variable gain element then a sudden change of the gain of the variable gain element to the second gain setting will not vary the value of the compensation signal received at the amplifier. Thus, immediately following the change in gain setting, the compensation signal will continue to compensate for a 5 mV offset whereas the notional compensation level required is for 6 mV. Thus the output signal will jump from a 0V corrected level to having an actual offset of +1 mV.

If the compensation signal were instead applied to the signal path before the variable gain element then the sudden change in gain would also result in a sudden change in the value of the compensation signal at the amplifier. In this simplistic example the value of the compensation signal would effectively change to a notional correction of 7.5 mV. This is actually greater than required and thus would lead to a jump in amplifier output by −1.5 mV.

In this simple example therefore even where any DC offset has been completely corrected for at one gain setting a change in gain setting, for example due to a change in a volume setting, may result in a sudden change in the voltage level of the output signal. Of course the compensation circuitry may then start to adjust to the new settings and act reduce the resulting offset but the sudden jump on change of gain setting may result in an audible artefact such as a pop.

It will also be appreciated that the example above discussed a separate variable gain element between the DAC and amplifier. Similar considerations however apply wherein the gain of the amplifier itself is variable, for example via a variable resistor feedback.

Figure 9:
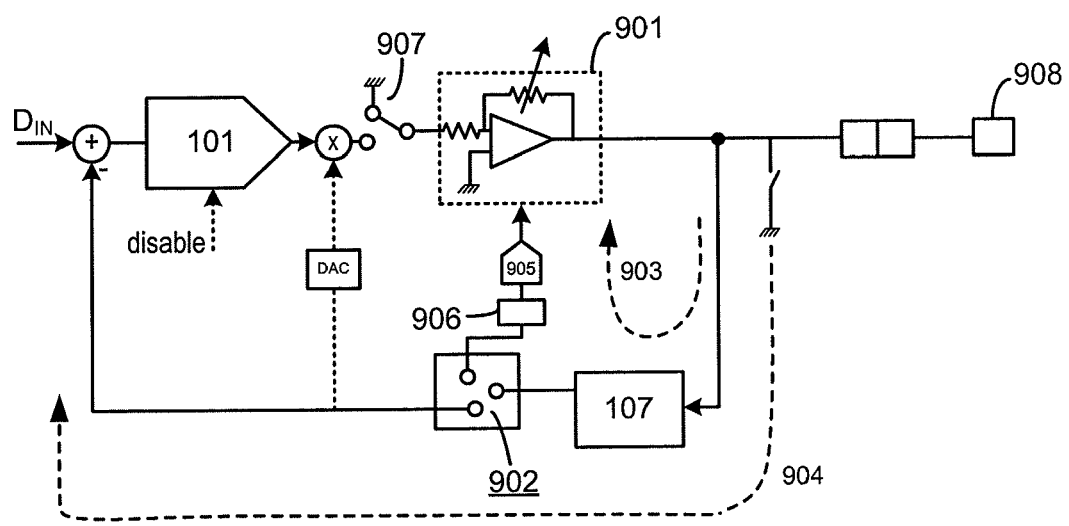
FIG. 9 shows an embodiment of the offset compensation circuitry having inner and outer feedback loops.

FIG. 9 illustrates an embodiment of the invention which has two feedback paths (forming two feedback loops) for compensating for DC offset of different parts of the audio signal path separately. The signal path comprises a digital input $D_{IN}$, a DAC 101 as described previously and a variable gain amplifier 901. The signal path includes a connector such as a socket if in use is connected to a connector such as a jack and to a load 908. The circuit has offset compensation circuitry 107 arranged with a switch, or multiplexer, arrangement 902 to provide two alternative feedback paths, an inner feedback path 903 and an outer feedback path 904. The inner path 903 comprises a further DAC 905 and a latch 906 and feeds back an analogue compensation signal to the variable gain amplifier 901. The outer path 904 feeds back a digital compensation signal upstream of DAC 101.

In operation the inner loop, defined by inner path 903, operates first to compensate for offset arising in the variable gain amplifier 901. The DAC 101 would be isolated from the input to the amplifier 901 and the amplifier (typically the input resistor rather than the op amp terminal) shorted to ground. The DAC 101 could be isolated by a series switch 907 but in some embodiments the DAC could be disabled by asserting a disable signal. In the disabled state the output of the DAC 101 would be high impedance. This may avoid the need for switches in audio signal path. With the DAC 101 disconnected or disabled, the operation of this inner loop 903 is to compensate for any offset arising in the amplifier 901. Once a stable offset value has been reached this value is stored in latch 906, the compensation circuitry 107 may be reset and the switch 902 switches the output of the compensation circuit to the outer loop 904.

As any offset due to the amplifier is corrected by the value latched in latch 906 the offset in the signal line due to the DAC will then be compensated for. The result is that, using the figures described above the inner loop, defined by path 903, will develop a compensation value of 3 mV for the amplifier. Subsequent operation of the outer loop, defined by path 904, will then develop a compensation signal for the DAC that ensures that the output of the DAC has zero, or a very small offset. Thus even is the gain of amplifier 901 is adjusted the offset contribution from the DAC will be small. The result is that there will be no significant jumps in DC offset on changes in the value of gain applied. Thus this embodiment having a plurality of feedback paths defining different feedback loops separately adjusts for the offset introduced upstream of a variable gain and the offset introduced downstream of the variable gain so that any changes in gain do not result in a sudden mismatch between the level of DC offset and the level of the compensation signal. Two feedback loops are illustrated in FIG. 9 but more feedback loops may be used in other applications if required. It will also be appreciated that in some embodiments a separate variable gain element such as a pre-amplifier could be included in the audio signal path. The inner and outer feedback loops could be arranged to separately adjusted for any offset upstream or downstream of the variable gain.

Note that the concept of having a plurality of feedback loops for compensating separately for the offset upstream and downstream of a variable gain element represents another aspect of the present invention and, whilst advantageously may implemented by the novel DC offset compensation circuitry described herein it may also be implemented by other types of DC offset compensation circuitry such as the known ADC based offset compensation circuitry.

In general the embodiments of the present invention therefore allow fast and accurate compensation for DC offset in signal lines using relatively small and inexpensive offset compensation circuitry. The offset compensation circuitry may have a variable gain to allow fast compensation to a relatively coarse accuracy initial followed by a more accurate compensation in order maximise settling time.

The offset compensation circuitry may be arranged as part of an audio amplifier and/or signal processing circuit, for instance an audio circuit which may be provided in a host device to act as hub for dealing with the various audio signals generated or received by the device. A dedicated offset compensation circuit may be provided for each audio signal output or multiplexed between a small number of outputs. An audio circuit comprising an embodiment of the offset compensation circuitry may be implemented in a host device, especially a portable and/or battery powered host device such as a mobile telephone, an audio player, a video player, a PDA, a mobile computing platform and/or a games device for example. In such applications the small size of the circuitry may be important and the increased efficiency from reducing DC offset power wastage may give system-level benefits such as increased operating time before battery re-charge is needed.

Embodiments of the invention have been described in terms of audio circuitry. In general however aspects of the present invention relate to the compensation for unwanted DC offset in any signal line and various sensors or other signal lines, such a video signal lines for example may have unwanted DC offset that could benefit from DC offset correction as described herein.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. The word "amplify" can also mean "attenuate", i.e. decrease, as well as increase, i.e. amplify. Any reference numerals or labels in the claims shall not be construed so as to limit their scope.

What is claimed is:

1. Audio amplification circuitry comprising:
   an amplifier configured to receive an input signal and provide an amplified output signal; and
   a feedback path, wherein said feedback path comprises compensation circuitry for outputting a compensation signal, wherein the compensation circuitry comprises:
      a voltage controlled oscillator (VCO) configured to sequentially receive a signal based on said amplified output signal and a reference signal so as to sequentially provide a first VCO output signal based on said amplified output signal and a second VCO output signal based on said reference signal, and
      a counter configured to generate first pulse counts based upon the first VCO output signal and second pulse counts based upon the second VCO output signal and to provide the compensation signal based on a comparison of the first and second pulse counts.

2. Audio amplification circuitry as claimed in claim 1 further comprising a multiplexer configured to receive a signal based on the amplified output signal and the reference signal as inputs and to sequentially provide one of said signals at said inputs to the voltage controlled oscillator.

3. Audio amplification circuitry as claimed in claim 1 wherein the counter comprises an integrating counter configured to integrate a difference between said first and second pulse counts over a plurality of periods of the first VCO output signal and second VCO output signal.

4. Audio amplification circuitry as claimed in claim 3 wherein the integrating counter comprises a pulse counter and an integrator acting on the output of the pulse counter.

5. Audio amplification circuitry as claimed in claim 3 wherein the integrating counter comprises an up/down counter.

6. Audio amplification circuitry as claimed in claim 1 wherein the compensation circuitry is configured to have a controllably variable bandwidth.

7. Audio amplification circuitry as claimed in claim 6 wherein the compensation circuitry comprises a variable gain element for varying the bandwidth.

8. Audio amplification circuitry as claimed in claim 7 wherein the variable gain element comprises a multiplier configured to receive a difference between said first and second pulse counts from the counter for each period of first VCO output signal and second VCO output signal and to multiply said difference by a gain factor.

9. Audio amplification circuitry as claimed in claim 8 wherein the counter is an integrating counter and wherein the output from the integrating counter is differentiated in a differentiator to provide said difference between said first and second pulse counts for each period of first VCO output signal and second VCO output signal which is input to the variable gain element.

10. Audio amplification circuitry as claimed in claim 8 wherein the output from the variable gain element is input to an integrator.

11. Audio amplification circuitry as claimed in claim 6 wherein the compensation circuitry is configured to, in use, have a first bandwidth during an initial period and then have a second, lower, bandwidth during a later period.

12. Audio amplification circuitry as claimed in claim 1 wherein the compensation signal is applied to said amplifier.

13. Audio amplification signal as claimed in claim 12 wherein the compensation signal directly modulates the input offset voltage of the amplifier.

14. Audio amplification circuitry as claimed in claim 1 wherein the feedback path comprises an inner feedback path configured to compensate for offset in a first part of the audio signal path and an outer feedback path configured to compensate for offset in a second part of the audio signal path.

15. Audio amplification circuitry as claimed in claim 14 wherein the compensation signal is switchable between the inner and the outer feedback loops.

16. Audio amplification circuitry as claimed in claim 1 comprising at least one pair of audio signal paths, each signal path comprising an amplifier configured to receive an input signal and provide an amplified output signal, wherein each pair of signal paths comprises compensation circuitry that is switchable between said pair of signal paths.

17. Audio amplification circuitry as claimed in claim 1 further comprising a clock divider for dividing a master clock signal in two to provide a counter clock signal for clocking the counter wherein the clock divider is configured to be physically adjacent the counter.

18. An audio processing circuit comprising audio amplification circuitry as claimed in claim 1.

19. An audio device comprising audio amplification circuitry as claimed in claim 1.

20. A device as claimed in claim 19 wherein said device is at least one of: a battery powered device, a portable device, a personal audio device, a personal video device; a mobile telephone, a personal data assistant, a gaming device, a portable computing device, a laptop and a satellite navigation system.

21. A method of compensating for DC offset in an audio amplifier output signal, the method comprising the steps of:
receiving a signal based on the amplifier output signal;
receiving a reference signal based on a target DC offset;
sequentially driving a voltage controlled oscillator (VCO) with the signal based on the amplifier output signal to provide a first VCO output signal; and
driving the same voltage controlled oscillator (VCO) with the reference signal to provide a second VCO output signal;
generating first pulse counts based upon the first VCO output signal and second pulse counts based upon the second VCO output signal;
comparing said first and second pulse counts; and
deriving a DC offset compensation signal from said comparison of pulse count.

22. A method as claimed in claim 21 further comprising integrating a difference between said first and second pulse counts to derive said DC offset compensation signal.

23. A method as claimed in claim 21 further comprising the step of applying a variable gain factor to a difference between said first and second pulse counts.

24. A method as claimed in claim 23 comprising applying a first gain factor for an initial period to provide a coarse compensation and subsequently applying a second gain factor in a subsequent period to provide a more accurate compensation.

25. A method as claimed in claim 21 comprising performing the method only in the absence of an audio signal to be amplified.

* * * * *